(12) United States Patent
Pereira et al.

(10) Patent No.: US 11,329,240 B2
(45) Date of Patent: May 10, 2022

(54) INFRARED PHOTODETECTOR

(71) Applicants: Commissariat à l'Énergie Atomique et aux Énergies Alternatives, Paris (FR); ISORG, Limoges (FR)

(72) Inventors: Alexandre Pereira, Saint-Martin-le-Vinoux (FR); Cédric Ducros, Bevenais (FR); Wilfrid Schwartz, Grenoble (FR)

(73) Assignees: Commissariat à l'Énergie Atomique et aux Énergies Alternatives, Paris (FR); ISORG, Limoges (FR)

( * ) Notice: Subject to any disclaimer, the term of this patent is extended or adjusted under 35 U.S.C. 154(b) by 0 days.

(21) Appl. No.: 15/830,081

(22) Filed: Dec. 4, 2017

(65) Prior Publication Data

US 2018/0159058 A1    Jun. 7, 2018

(30) Foreign Application Priority Data

Dec. 5, 2016  (FR) .................. 16/61919

(51) Int. Cl.
| | |
|---|---|
| *H01L 51/42* | (2006.01) |
| *H01L 51/00* | (2006.01) |
| *H01L 51/44* | (2006.01) |
| *G01J 5/20* | (2006.01) |
| *H01L 27/30* | (2006.01) |

(52) U.S. Cl.
CPC ............. *H01L 51/424* (2013.01); *G01J 5/20* (2013.01); *H01L 27/305* (2013.01); *H01L 51/0097* (2013.01); *H01L 51/4253* (2013.01); *H01L 51/44* (2013.01); *H01L 51/0036* (2013.01); *H01L 51/0037* (2013.01); *H01L 51/0043* (2013.01); *Y02E 10/549* (2013.01)

(58) Field of Classification Search
CPC . H01L 51/424; H01L 27/305; H01L 51/0097; H01L 51/4253; H01L 51/44; H01L 51/0036; H01L 51/0037; H01L 51/0043; G01J 5/20; Y02E 10/549
USPC .......................................................... 257/40
See application file for complete search history.

(56) References Cited

U.S. PATENT DOCUMENTS

| | | | |
|---|---|---|---|
| 5,398,133 A | 3/1995 | Tsai et al. | |
| 5,698,048 A | 12/1997 | Friend et al. | |
| 7,718,130 B1 | 5/2010 | Shinar et al. | |
| 2002/0017612 A1* | 2/2002 | Yu .................. | B82Y 10/00 250/370.11 |
| 2009/0321865 A1* | 12/2009 | Kasano .................. | G02B 5/201 257/432 |

(Continued)

FOREIGN PATENT DOCUMENTS

WO    WO 03/067677    8/2003

OTHER PUBLICATIONS

Preliminary Search Report for French Application No. 16/61919, dated Sep. 18, 2017.

(Continued)

*Primary Examiner* — Dzung Tran
(74) *Attorney, Agent, or Firm* — Wolf, Greenfield & Sacks, P.C.

(57) ABSTRACT

An infrared photodetector including a stack of layers on a substrate having an active area made of organic semiconductor materials capable of converting an infrared radiation into an electric signal and including, in said stack and/or on the substrate, a single layer at least partially filtering visible light.

5 Claims, 4 Drawing Sheets

(56) References Cited

U.S. PATENT DOCUMENTS

| | | | |
|---|---|---|---|
| 2010/0044569 A1 | 2/2010 | Hung | |
| 2010/0117991 A1* | 5/2010 | Koyama | G02F 1/13338 345/175 |
| 2010/0127247 A1* | 5/2010 | Yang | B82Y 10/00 257/40 |
| 2010/0294936 A1 | 11/2010 | Böberl et al. | |
| 2011/0228097 A1* | 9/2011 | Motta | H04N 5/33 348/164 |
| 2012/0085890 A1* | 4/2012 | Kurokawa | H01L 27/14678 250/208.2 |
| 2013/0026459 A1 | 1/2013 | Yoshimura et al. | |
| 2014/0034835 A1 | 2/2014 | Frey et al. | |
| 2014/0217284 A1* | 8/2014 | So | H01L 51/4213 250/330 |
| 2017/0371149 A1* | 12/2017 | Sakai | G02B 26/005 |

OTHER PUBLICATIONS

Arca et al. Near-Infrared Organic Photodiodes. IEEE Journal of Quantum Electronics. Dec. 2013;49(12):1016-25.

Binda et al. Fast and air stable near-infrared organic detector based on squaraine dyes. Organic Electronics. 2009;10:1314-9.

Binda et al. High detectivity squaraine-based near infrared photodetector with nA/cm2 dark current. Applied Physics Letters. 2011;98:073303-1-3.

Chen et al. Efficient planar organic solar cells with the high near-infrared response. Organic Electronics. 2012;13:1086-91.

Dou et al. Synthesis of 5H-Dithieno[3,2-b:2',3'-d]pyran as an Electron-Rich Building Block for Donor-Acceptor Type Low-Bandgap Polymers. Macromolecules. 2013;46:3384-90.

Gong et al. High-Detectivity Polymer Photodetectors with Spectral Response from 300 nm to 1450 nm. Science. Sep. 2009;325:1665-7.

Hermenau et al. Water and oxygen induced degradation of small molecule organic solar cells. Solar Energy Materials & Solar Cells. 2011;95:1268-77.

Liang et al. Porphyrin small molecules containing furan- and selenophene-substituted diketopyrrolopyrrole for bulk heterojunction organic solar cells. Organic Electronics. 2016;29:127-34.

Norrman et al. Degradation Patterns in Water and Oxygen of an Inverted Polymer Solar Cell. Journal of the American Chemical Society. 2010;132:16883-92.

Sharma et al. Degradation analysis of PCDTBT:PC71BM organic solar cells-an insight. Current Applied Physics. 2016;16:273-7.

Tong et al. Intrinsic burn-in efficiency loss of small-molecule organic photovoltaic cells due to exciton-induced trap formation. Solar Energy Materials & Solar Cells. 2013;118:116-23.

Wang et al. High speed responsive near infrared photodetector focusing on 808 nm radiation using hexadecafluoro-copper-phthalocyanine as the acceptor. Organic Electronics. 2011;12:34-8.

Yao et al. Plastic Near-Infrared Photodetectors Utilizing Low Band Gap Polymer. Advanced Materials. 2007;19:3979-83.

You et al. A polymer tandem solar cell with 10.6% power conversion efficiency. Nature Communications. 2013;4(1446):1-10.

Zhang et al. Transparent Organic Photodetector using a Near-Infrared Absorbing Cyanine Dye. Scientific Reports. 2015;5(9439):1-6.

* cited by examiner

INFRARED PHOTODETECTOR

This application claims priority to French patent application number 16/61919, filed Dec. 5, 2016, the content of which is incorporated herein by reference in its entirety to the maximum extent allowable by law.

BACKGROUND

The present application relates to an infrared photodetector and to a method of manufacturing the same.

DISCUSSION OF THE RELATED ART

An electromagnetic radiation detection device, or photodetector, enables to convert electromagnetic radiation into an electric signal. It has already been provided to form photodetectors based on conducting materials and on organic semiconductors. The active area of the photodetector is the area where most of the incident radiation is absorbed and converted into an electric signal. A photodetector having its active area made of organic materials is called organic photodetector. Organic materials have the advantage of being easier to deposit and more resistant than inorganic conducting and semiconductor materials, for example, silicon, used in conventional technological processes.

The use of organic materials advantageously enables to form the photodetector on any types of substrate and in particular on flexible substrates such as plastic, paper, cardboard, or fabric, on substrates having large dimensions, for example, signboards, or on disposable substrates such as convenience good packages.

The semiconductor materials forming the photodetector may be selected to enable to detect an infrared radiation. The photodetector is for example associated with an infrared light-emitting diode and enables to detect the electromagnetic radiation emitted by the light-emitting diode.

However, for organic semiconductor materials usable for the detection of an infrared radiation, the frequency range of the radiation absorbed by the active area of the photodetector is generally wider than the frequency band corresponding to an infrared radiation, so that the electric signal supplied by the photodetector may be polluted by the detection of a parasitic radiation, particularly the ambient visible light, outside of the frequency range of interest.

It may be necessary to associate an optical filter with the photodetector, which is at least partially opaque to the radiation of frequencies located outside of the frequency range of interest, to decrease the effects of parasitic radiation, particularly of visible light. To decrease the photodetector bulk, it would be desirable to form the optical filter in such a way that it is integrated with the photodetector. Patent application EP1432044 describes the forming of an optical filter comprising depositing a polysilicon layer on a photodetector. However, such a deposition is carried out at a temperature higher than 400° C. and cannot be implemented with an organic photodetector, particularly comprising a plastic substrate.

SUMMARY

An object of an embodiment is to overcome all or part of the disadvantages of previously-described infrared photodetectors.

Another object of an embodiment is to form an optical filter in such a way that it is integrated with an organic photodetector.

Another object of an embodiment is for the photo-detector to be formed on a flexible substrate.

Another object of an embodiment is to form an optical filter for an organic photodetector in simple fashion.

Another object of an embodiment is to form an optical filter for an organic photodetector at a low temperature.

Thus, an embodiment provides an infrared photodetector comprising a stack of layers on a substrate having an active area made of organic semiconductor materials capable of converting an infrared radiation into an electric signal and comprising, in said stack and/or on the substrate, a single layer at least partially filtering visible light.

According to an embodiment, the filtering layer comprises a material selected from the group comprising amorphous silicon, amorphous germanium and silicon alloys, copper, indium, gallium, and selenium alloys, copper, zinc, and tin sulphide, or a mixture of at least two of these compounds.

According to an embodiment, the thickness of the filtering layer is in the range from 50 nm to 150 nm.

According to an embodiment, the substrate is flexible.

According to an embodiment, the substrate is selected from the group comprising polyethylene naphthalene, polyethylene terephthalate, poly(methyl methacrylate), polycarbonate, poly-etheretherketone, or a polyimide.

An embodiment also provides an optoelectronic system comprising an infrared photodetector such as previously defined and an infrared radiation source.

According to an embodiment, the method comprises manufacturing the filtering layer at a temperature lower than 200° C.

According to an embodiment, the filtering layer is deposited by cathode sputtering, by electron beam physical vapor deposition, by ion beam sputtering, or by thermal evaporation.

The foregoing and other features and advantages will be discussed in detail in the following non-limiting description of specific embodiments in connection with the accompanying drawings.

DETAILED DESCRIPTION

Figure 1:
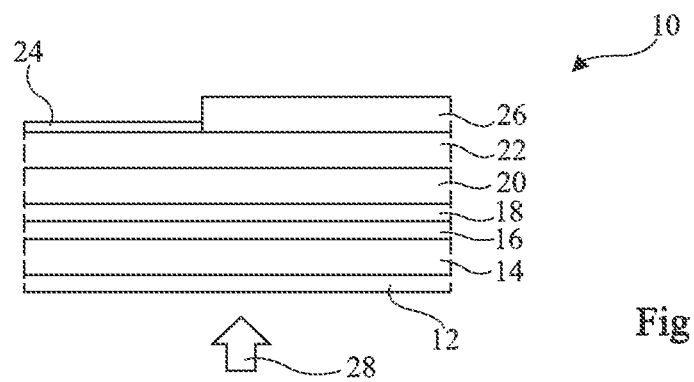
FIGS. 1 to 4 are partial simplified cross-section views of embodiments of an infrared organic photodetector.

For clarity, the same elements have been designated with the same reference numerals in the various drawings and, further, the various drawings are not to scale. Further, only those elements which are useful to the understanding of the described embodiments have been shown and are described. In particular, the means for processing the signals supplied by the photodetectors described hereafter are within the abilities of those skilled in the art and are not described. In the following description, unless otherwise specified, terms "substantially", "approximately", and "in the order of" mean "to within 10%".

In the following description, "visible light" designates an electromagnetic radiation having a wavelength in the range from 400 nm to 700 nm and "infrared radiation" designates an electromagnetic radiation having a wavelength in the range from 700 nm to 1 mm. In infrared radiation, one can particularly distinguish near infrared radiation having a wavelength in the range from 700 nm to 1.4 µm.

FIG. 1 shows an embodiment of an infrared organic photodetector 10. Photodetector 10 comprises, from bottom to top:
a layer 12 forming an optical filter;
a first substrate 14;
an electrically-conducting layer 16 forming a first electrode;
a first interface layer 18;
an active area 20;
a second interface layer 22;
an electrically-conducting layer 24 forming a second electrode; and
a second substrate 26.

In the present embodiment, photodetector 10 is intended to be illuminated on the side of optical filter 12 by an incident radiation represented by arrow 28, particularly comprising an infrared radiation.

In FIG. 1, electrode 24 and substrate 26 are shown next to each other and resting on interface layer 22. As a variation, electrode 24 may entirely cover interface layer 22 and substrate 26 may entirely cover electrode 24.

As a variation, first interface layer 18 or second interface layer 22 may be omitted. Further, it is possible to have only one of the two substrates 14, 26 or for one of the two substrates 14, 26 to be replaced with a protection layer.

Substrate 14 or 26 may be made of a dielectric material. Substrate 14 or 26 is preferably a flexible support. The flexibility of a material may be defined by the minimum radius of curvature that can be applied to the material beyond which the material can recover its initial shape. In the present description, "flexible support" designates a support for which the minimum radius of curvature which can be applied to the support beyond which the support may recover its initial shape is 1 mm. Examples of polymer are polyethylene naphthalene (PEN), polyethylene terephthalate (PET), poly(methyl methacrylate) (PMMA), polycarbonate (PC), polyetheretherketone (PEEK), or a polyimide, particularly kapton. The thickness of substrate 14 or 26 is for example in the range from 20 µm to 1 cm. In the present embodiment, substrate 14 is at least partially transparent to infrared radiation.

Each electrode 16 or 24 may be made of conducting oxide transparent to infrared radiation (TCO: Transparent Conducting Oxide), of carbon nanotubes, of graphene, of a conducting polymer, of a metal or of a mixture or an alloy of at least two of these compounds. Electrode 16 or 24 may have a single-layer structure or a multi-layer structure. The thickness of electrode 16 or 24 is in the range from 5 nm to 200 nm. In the present embodiment, electrode 16 is intended to be crossed by radiation 28. It is made of an electrically-conducting material at least partially transparent to infrared radiation.

Examples of TCOs capable of forming conducting tracks 24 are indium tin oxide (ITO), aluminum zinc oxide (AZO), and gallium zinc oxide (GZO). Examples of conducting polymers capable of forming electrodes are the polymer known as PEDOT:PSS, which is a mixture of poly(3,4)-ethylene-dioxythiophene and of sodium poly(styrene sulfonate), or poly-aniline, also called PAni. Examples of metals capable of forming the electrodes are silver (Ag), gold (Au), copper (Cu), nickel (Ni), titanium (Ti), and chromium (Cr). An example of a multilayer structure capable of forming electrodes is a multilayer AZO and silver structure of AZO/Ag/AZO type. The electrode thickness may be in the range from 10 nm to 5 µm. In the case where electrode 24 is metallic and should be at least partially transparent to infrared radiation, the electrode thickness is smaller than or equal to 20 nm, preferably smaller than or equal to 10 nm. It may then correspond to silver nanowires.

Active area 20 may comprise small organic molecules, organic oligomers, or organic polymers. Active area 20 may comprise an ambipolar semiconductor material, or a mixture of an N-type semiconductor material and of a P-type semiconductor material, for example in the form of stacked layers or of an intimate mixture at a nanometer scale to form a volume heterojunction. The thickness of active area 20 may be in the range from 50 nm to 1 µm, for example, in the order of 500 nm.

Examples of P-type organic semiconductor materials capable of forming active area 20 are poly[(4,8-bis-(2-ethylhexyloxy)-benzo[1,2-b;4,5-b']dithiophene)-2,6-diyl-alt-(4-(2-ethylhexanoyl)-thie-no[3,4-b]thiophene))-2,6-diyl];4,5-b']di-thiophene)-2,6-diyl-alt-(5,5'-bis(2-thienyl)-4,4,-dinonyl-2,2'-bithiazole)-5',5"-diyl] (PBDTTT-C), poly[2,6-(4,4-bis-(2-ethyl-hexyl)-4H-cyclopenta[2,1-b;3,4-b'] dithiophene)-alt-4,7(2,1,3-benzothiadiazole)] (PCPDTBT), poly[2,7-(5,5-bis-(dimethyloctyl)-5H-dithieno[3,2-b:20,30-d]pyran)-alt-4,7-(5,6-difluoro-2,1,3-benzothiadiazole)] (PDTP-DFBT), squaraine (SQ), poly tri-methylene terephthalate (PTT), poly(5,7-bis(4-decanyl-2-thienyl) thieno[3,4-b]diathiazole-thiophene-2,5) (PDDTT), or 2,5-bis(4-biphenylyl)-bithiophene/2,5-bis(4-biphenylyl)-bithiophene (BP2T/TiOPc).

Examples of N-type semiconductor materials capable of forming active area 20 are fullerenes, particularly C60,

[6,6]-phenyl-$C_{61}$-methyl butanoate ([60]PCBM), [6,6]-phenyl-$C_{71}$-methyl butanoate ([70]PCBM), or perylene diimide (PDI).

Interface layer 18 enables to align the work function of electrode 16 with the electronic affinity of the acceptor material used in active area 20 and interface layer 22 enables to align the work function of electrode 24 with the ionization potential of the donor used in active area 20. According to the diode biasing mode, interface layers 18, 22 ease the collection, the injection, or the blocking of charges from electrodes 16, 24 in active area 20. The thickness of each interface layer 18, 22 is preferably in the range from 0.1 nm to 1 μm.

Interface layer 18 may be made of zinc oxide (ZnO), of cesium carbonate ($CSCO_3$), or of a mixture of at least two of these compounds. Interface layer 18 is preferably made of a metal oxide, more preferably of zinc oxide. Interface layer 18 may comprise a self-assembled monomolecular layer or a polymer, for example, polyethyleneimine, ethoxylated polyethyleneimine, or poly[(9,9-bis(3'-(N,N-dimethyl-amino)propyl)-2,7-fluorene)-alt-2,7-(9,9-dioctylfluorene)] (PFN).

Interface layer 22 may be made of copper oxide (CuO), of nickel oxide (NiO), of vanadium oxide ($V_2O_5$), of magnesium oxide (MgO), of tungsten oxide ($WO_3$), of molybdenum trioxide ($MoO_3$), of PEDOT:PSS, or of a mixture of at least two of these compounds.

Layer 12 enables to filter incident radiation 28 to at least partially block frequencies outside of a frequency range of interest. According to an embodiment, layer 12 transmits at least 30% of incident radiation 28 for the wavelength range from 700 nm to 1.4 μm and transmits less than 40% of incident radiation 28 for the wavelength range from 400 nm to 700 nm.

Layer 12 may be made of a material selected from the group comprising amorphous silicon (aSi), amorphous germanium and silicon alloys (aSiGe), copper, indium, gallium, and selenium alloys (CIGS), copper, zinc, and tin sulphide (CZTS), or a mixture of at least two of these compounds. Preferably, layer 12 has a single-layer structure. The thickness of layer 20 12 is in the range from 50 nm to 150 nm, preferably from 70 nm to 120 nm.

Figure 2:
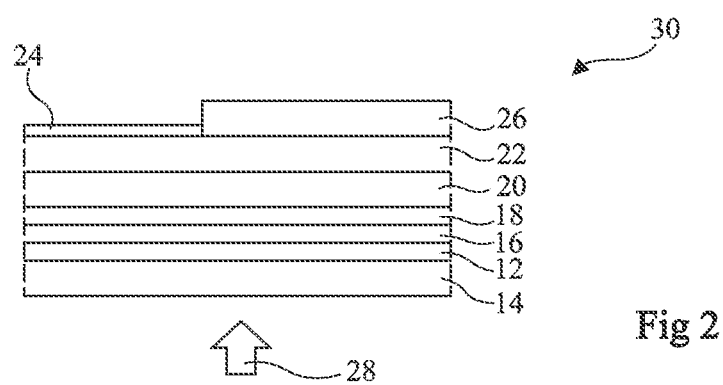

FIG. 2 shows another embodiment of a photodetector 30. Photodetector 30 comprises all the elements of photodetector 10 shown in FIG. 1, with the difference that optical filter 12 is interposed between substrate 14 and electrode 16.

Figure 3:
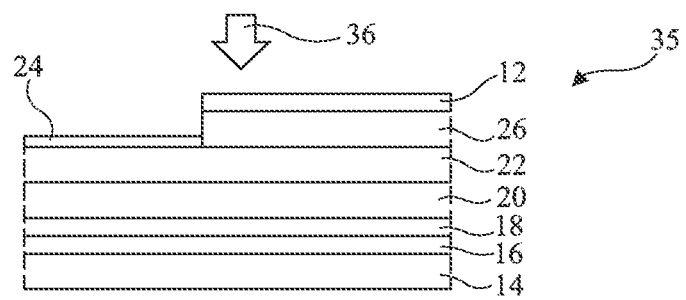

FIG. 3 shows another embodiment of a photodetector 35. Photodetector 35 comprises all the elements of photodetector 10 shown in FIG. 1, with the difference that optical filter 12 covers substrate 26 and that photodetector 35 is illuminated on the side of substrate 26 as indicated by arrow 36.

Figure 4:
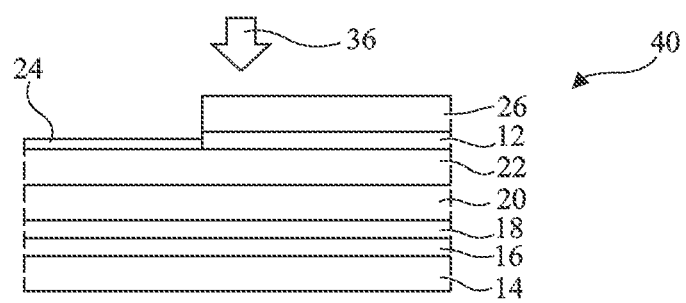

FIG. 4 shows another embodiment of a photodetector 40. Photodetector 40 comprises all the elements of photodetector 35 shown in FIG. 3, with the difference that optical filter 12 is interposed between substrate 26 and interface layer 22.

A method of manufacturing previously-described photodetectors 10, 30, 35, and 40 comprises successively forming the layers forming photodetector 10 on substrate 14, that is, optical filtering layer 12, electrode 16, interface layer 18, active area 20, interface layer 22, and electrode 24. Substrate 26 may then be glued to interface layer 22.

According to the material used for electrode 16, interface layer 18, active area 20, interface layer 22, and electrode 24, the method of forming the considered layer may correspond to a so-called additive process, for example, by direct printing of the material forming the considered layer at the desired locations, particularly in sol-gel form, for example, by inkjet printing, photogravure, silk-screening, flexography, spray coating, or drop casting. The method of forming the considered layer may correspond to a so-called subtractive method, where the material forming the considered layer is deposited all over the structure and where the non-used portions are then removed, for example, by photolithography or laser ablation. According to the considered material, the deposition over the entire structure may be performed, for example, by liquid deposition, by cathode sputtering, or by evaporation. Methods such as spin coating, spray coating, heliography, slot-die coating, blade coating, flexography, or silk-screening, may in particular be used. When electrode 16 and 24 is metallic, the metal is, for example, deposited by evaporation or by cathode sputtering on the underlying structure and electrode 16 or 24 is delimited by etching.

Layer 12 forming the optical filter is deposited by physical vapor deposition (PVD), particularly by cathode sputtering, and especially by magnetron cathode sputtering, by electron beam physical vapor deposition (PVD e-beam), by ion beam sputtering (IBS), or by thermal evaporation. Preferably, layer 12 is deposited by magnetron cathode sputtering. According to an embodiment, the deposition temperature is lower than 200° C., preferably lower than 150° C., more preferably lower than 100° C., particularly lower than 80° C.

Advantageously, at least some of the layers of detection device 10 may be formed by printing techniques. The materials of previously-described layers 16, 18, 20, 22 may be deposited in liquid form, for example, in the form of conductor and semiconductor inks by means of inkjet printers. "Materials in liquid form" here also designates gel materials capable of being deposited by printing techniques. Anneal steps may be provided between the depositions of the different layers, but it is possible for the anneal temperatures not to exceed 150° C., and the deposition and the possible anneals can be carried out at the atmospheric pressure.

Figure 5:
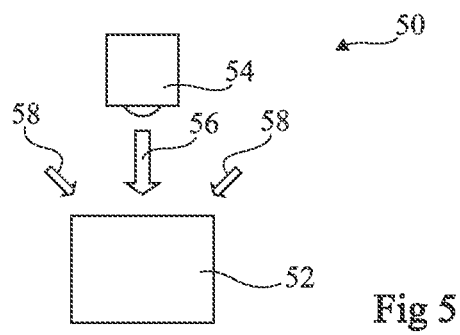
FIG. 5 is a simplified view of an optoelectronic system comprising an infrared photodetector.

FIG. 5 shows an embodiment of an optoelectronic system 50 comprising a photodetector 52, corresponding to one of previously-described photodetectors 10, 30, 35, 40 and to a source 54 of an infrared radiation 56. Source 52 may correspond to an infrared light-emitting diode, LED. As a variation, source 52 may correspond to a hot spot. Photodetector 52 may further receive a parasitic electromagnetic radiation 58, for example, ambient light. Optoelectronic system 50 is for example used for the detection of an object interposed between infrared source 54 and infrared photodetector 52.

Figure 6:
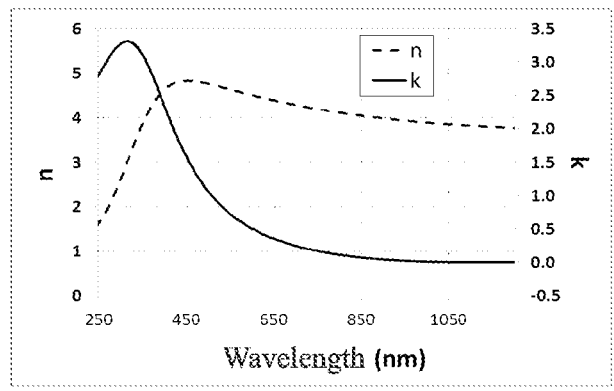
FIG. 6 shows curves of the variation of optical constants of the amorphous silicon according to the wavelength.

FIG. 6 shows curves of variation of optical constants, refraction index n in dashed line and extinction coefficient k in full line, of the amorphous silicon according to the wavelength.

Figure 7:
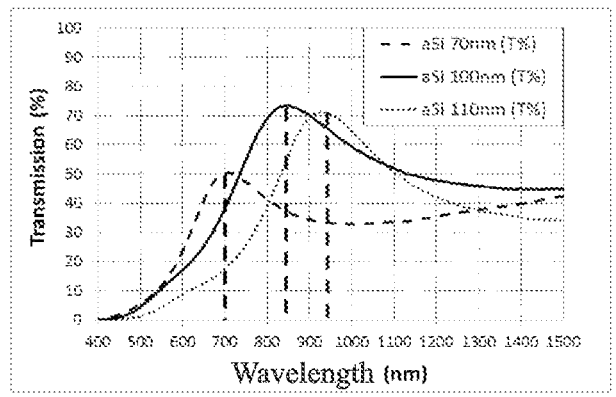
FIG. 7 shows curves of the variation of the transmission of a monochromatic electromagnetic radiation crossing an amorphous silicon layer according to the wavelength of the radiation for a plurality of thicknesses of the layer.

FIG. 7 shows curves of the variation of the transmission, expressed in percent, of a monochromatic electromagnetic radiation crossing layer 12 according to the wavelength of the radiation when layer 12 is an amorphous silicon layer deposited on a PET substrate for three thicknesses of layer 12. The curve in dashed line corresponds to a 70-nm thickness of layer 12, the curve in full line corresponds to a 100-nm thickness of layer 12, and the curve in dotted line corresponds to a 110-nm thickness of layer 12. As appears in the curves, optical filter 12 operates substantially as a high-pass filter and the transmission maximum varies according to the thickness of amorphous silicon layer 12. In particular, for a 100-nm thickness of layer 12, a transmission maximum is obtained for a 850-nm wavelength. Layer 12 thus enables to filter part of the wavelengths of visible light, between 400 nm and 700 nm. Since most organic semiconductor materials act as high-pass filters, the photodetector acts as a selective filter giving way to a frequency range which may be modulated according to the thickness of layer 12.

Figure 8:
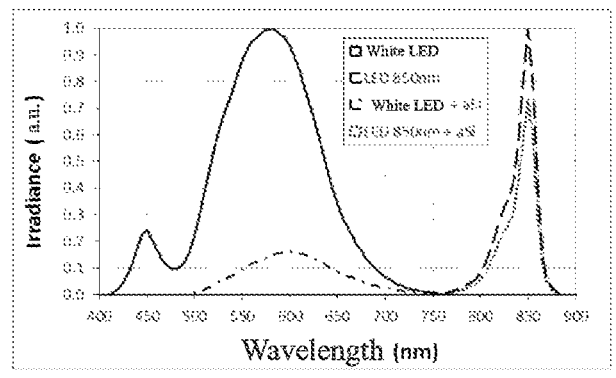
FIG. 8 shows curves of the variation of the irradiance of a white light source and of an infrared source in the absence and in the presence of an amorphous silicon layer.

FIG. 8 shows curves of the variation of the irradiance, expressed in arbitrary units (a.u.) of a LED supplying white light (curve in full line) and of the irradiance of an infrared LED supplying a radiation having its maximum irradiance centered on 850 nm (long-dashed line). FIG. 8 further shows the spectrums obtained when the radiations have crossed a 100-nm layer of amorphous silicon deposited on a PET substrate (curve in stripe-dot lines for white light and curve in dotted lines for infrared radiation). Optical filter 12 enables to block 90% of the white light while substantially giving way to most of the infrared radiation.

In the case of optoelectronic system 50 shown in FIG. 5, the infrared LED may correspond to excitation light source 54 and the white LED may correspond to the light source of parasitic radiation 58. The presence of optical filter 12 enables to increase the ratio of the infrared light to the white light seen by photodetector 52. The ratio passes from 0.23 in the absence of optical filter 12 to 1.12 in the presence of optical filter 12, that is, the increase factor is 5.

Figure 9:
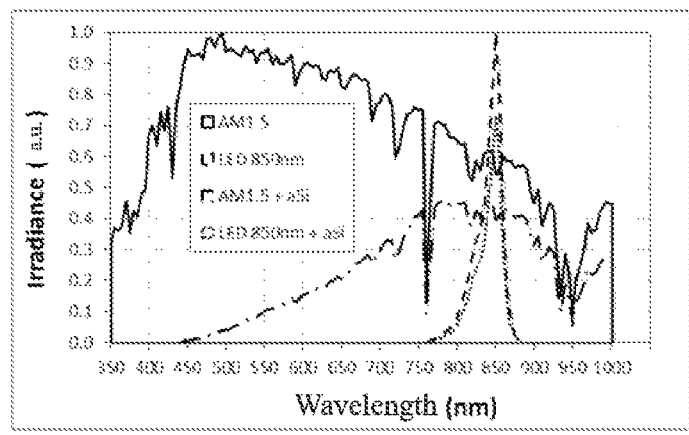
FIG. 9 is a diagram similar to FIG. 8 in the case where the white light is replaced with sunlight.

FIG. 9 is a diagram similar to FIG. 8 in the case where the white light is replaced with the sunlight, which has a spectrum corresponding to the AM 1.5-type spectrum defined by standard ASTM G-173-03. The presence of optical filter 12 enables to increase the ratio of the infrared light to the sunlight seen by photodetector 52. This ratio passes from 0.05 in the absence of optical filter 12 to 0.13 in the presence of optical filter 12, that is, the increase factor is 2.6.

Advantageously, optical filter 12 enables to increase the signal-to-noise ratio of the infrared organic photodetector in the case where the parasitic radiation is present.

Further, by varying the thickness of layer 12 forming the optical filter, the spectral response of the photodetector may be modified to adapt to the frequency range of the infrared radiation to be detected.

Optical filter 12 being integrated to the stack of layers forming the photodetector and itself corresponding to a single layer, the total thickness of the photodetector can be decreased. A compact photodetector can advantageously be obtained.

Due to the nature of the materials which may form layer 12 forming the optical filter and the decreased thickness of layer 12, a flexible photodetector can advantageously be achieved.

Tests have been carried out with a test photodetector. The test photodetector had the structure of photodetector 10 shown in FIG. 1, where layer 12 forming the optical filter was made of amorphous silicon and had a 100-nm thickness, substrate 14 was made of PET and had a 50-µm thickness, electrode layer 16 was made of ITO and had a 150-nm thickness, interface layer 18 was made of ZnO and had a 40-nm thickness, active area 20 corresponded to an intimate mixture at the nanometer range of PTT and $PC_{60}BM$ to form a volume heterojunction and had a 500-nm thickness, interface layer 22 was made of PEDOT:PSS and had a 700-nm thickness, electrode 24 was made of Ag and had a 100-nm thickness, and substrate 26 was made of PET and had a 50-µm thickness.

Figure 10:
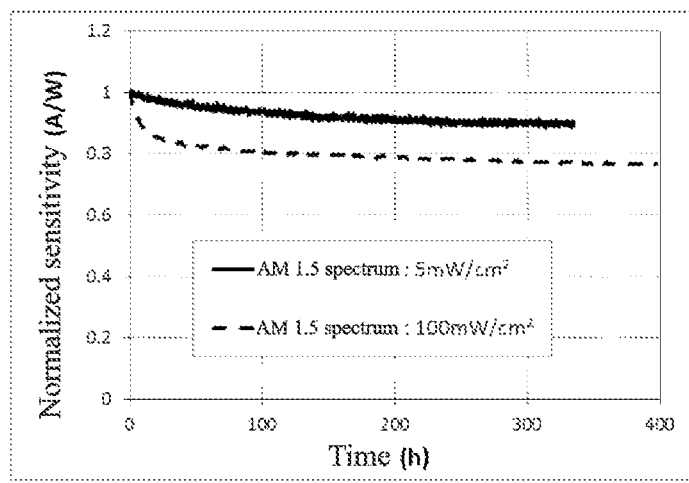
FIG. 10 shows curves of the variation of the sensitivity of a photodetector in the absence of an optical filter for different light power densities of an incident radiation.

FIG. 10 shows curves of the time variation of the sensitivity of the test photodetector in the absence of an optical filter 12 for a 5-mW/cm$^2$ light power density (curve in full line) and a 100-mW/cm$^2$ light power density (curve in dashed line). The sensitivity is proportional to the intensity of the current generated by the photodetector under an illumination. The sensitivity tends to decrease over time. This decrease is all the greater as the light power density is high. The presence of optical filter 12 enables to control the degradation of the sensitivity by blocking a large part of the visible light.

A comparative test has been performed with the test photodetector and a comparison photodetector. The comparison photodetector had the same structure as the test photodetector, with the difference that it did not comprise optical filter 12.

Figure 11:
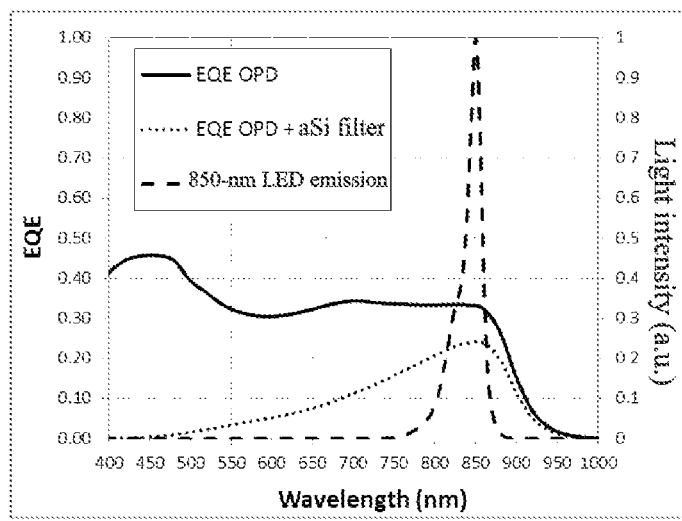
FIG. 11 shows a curve of the variation of the external quantum efficiency of a test photodetector and of a comparison photodetector.

FIG. 11 shows a curve of the variation, according to the wavelength of the incident radiation, of the external quantum efficiency of the test photodetector (curve in full line) and of the comparison photodetector (curve in dotted line). In FIG. 11, the curve of the variation, in dashed lines, of the light intensity in arbitrary units according to the wavelength of the radiation supplied by an infrared LED having an emission spectrum maximum for the 850-nm wavelength has been added. The presence of optical filter 12 enables to decrease the quantum efficiency of the test photodetector with respect to the comparison photodetector in the spectral range of visible light, for a wavelength in the range from 400 nm to 700 nm.

The comparison test has been carried out by simultaneously illuminating the test photodetector and the comparison photodetector with an infrared LED having the irradiance curve shown in FIG. 8 and having a maximum power of 300 µW/cm$^2$ and a white LED having the irradiance curve shown in FIG. 8 and having a maximum power of 60 µW/cm$^2$. This test enables to simulate the detection of an infrared radiation centered on the 850-nm wavelength in the presence of a parasitic radiation, that of the white LED. FIGS. 12 to 15 have been obtained as a result of the comparison test.

Figure 12:
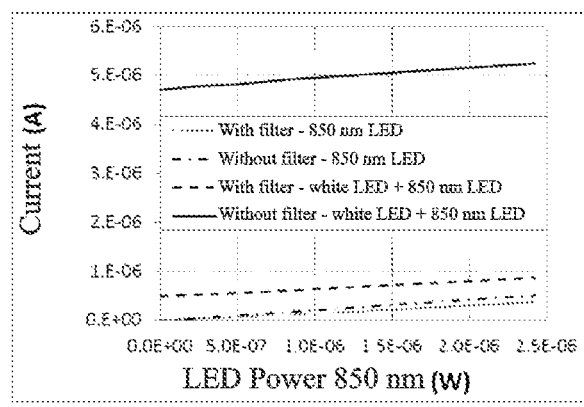
FIG. 12 shows curves of the variation of the current supplied in the presence of an infrared LED only and in the presence of the infrared LED and of a white LED of a test photodetector and of a comparison photodetector.

FIG. 12 shows curves of the variation, according to the power of the infrared LED, of the current supplied by the test photodetector in the presence of the infrared LED only (curve in dotted line) and in the presence of the infrared LED and of the white LED (curve in stripe-dot line), and curves of the variation, according to the power of the infrared LED, of the current supplied by the comparison photodetector in the presence of the infrared LED only (curve in dashed line) and in the presence of the infrared LED and of the white LED (curve in full line).

Figure 13:
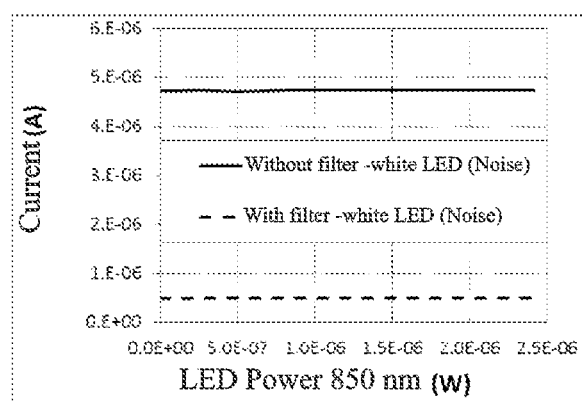
FIG. 13 shows curves of the variation of the portion of the current due to the white LED for the curves of FIG. 12.

FIG. 13 shows curves of the variation, according to the power of the infrared LED, of the portion of the supplied current due to white light for the test photodetector (curve in dashed line) and for the comparison photodetector (curve in full line).

In the presence of white light, the comparison photodetector supplies more current than the test photodetector due to the partial shadowing of the incident radiation in the presence of white light by optical filter 12 of the test photo-detector. Further, the comparison photodetector supplies more current in the presence of white light than in the absence of white light. Conversely, for the test photodetector, the current supplied in the absence of white light is close to the current supplied in the presence of white light. The test photodetector is thus little sensitive to the presence of white light. As appears in FIG. 13, the noise due to white light is decreased in the presence of optical filter 12.

Figure 14:
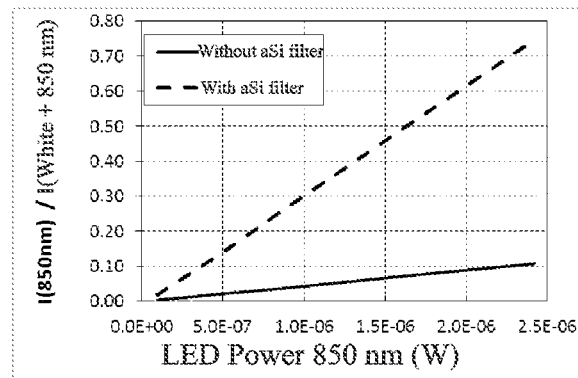
FIG. 14 shows curves of the variation of the ratio of the current supplied by a photodetector in the presence of an infrared LED only to the current supplied by the photodetector in the presence of the infrared LED and of a white LED for a test photodetector and a comparison photodetector.

FIG. 14 shows curves of the variation, according to the power of the infrared LED, of the ratio of the current supplied by the photodetector in the presence of the infrared LED only to the current supplied by the photodetector in the presence of the infrared LED and of the white LED for the test photodetector (curve in dashed line) and for the comparison photodetector (curve in full line). A gain by a factor 7 on the current ratio of the test photodetector with respect to the comparison photodetector is obtained.

Figure 15:
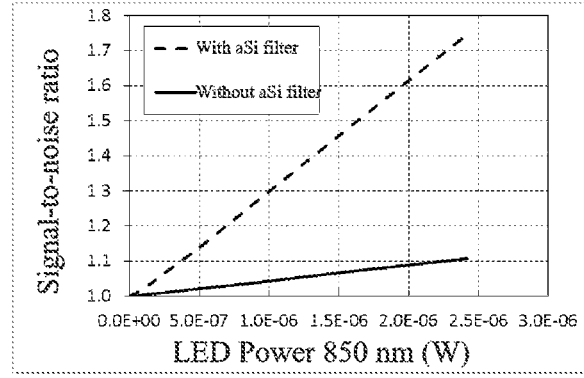
FIG. 15 shows curves of the variation of the signal-to-noise ratio between the current supplied by the photodetector in the presence of an infrared LED only and in the presence of the infrared LED and of a white LED for a test photodetector and a comparison photodetector.

FIG. 15 shows a curve of the variation, according to the power of the infrared LED, of the signal-to-noise ratio supplied by the photodetector for the test photodetector (curve in dashed line) and for the comparison photodetector (curve in full line). The signal-to-noise of the test photodetector is greater than that of the comparison photodetector.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An infrared photodetector comprising a stack of layers on a first substrate having an active area made of organic semiconductor materials capable of converting an infrared radiation into an electric signal and comprising, in said stack and/or on the first substrate, a single layer at least partially filtering visible light, wherein the filtering layer comprises at least a first material, wherein the first material is:
   (i) amorphous silicon (aSi);
   (ii) an amorphous germanium and silicon alloy (aSiGe);
   (iii) copper indium gallium selenide (CIGS), the CIGS comprising copper, and comprising selenium, and comprising indium and/or gallium; or
   (iv) copper zinc tin sulphide (CZTS), the CZTS comprising copper, and comprising zinc, and comprising tin, and comprising Sulphur,
   wherein the filtering layer is configured to transmit at least 30% of radiation having wavelengths between 700 nanometers and 1.4 micrometers,
   wherein the stack of layers includes a second substrate in contact with the filtering layer, the active area being interposed between the first and second substrates, each of the first and second substrates comprising a dielectric polymer and having a thickness between 20 μm to 1 cm,
   wherein the first substrate is flexible and the second substrate is flexible,
   wherein the first substrate is selected from the group comprising polyethylene naphthalene, polyethylene terephthalate, poly(methylmethacrylate), polycarbonate, polyetheretherketone, or a polyimide,
   the second substrate is selected from the group comprising polyethylene naphthalene, polyethylene terephthalate, poly(methylmethacrylate), polycarbonate, polyetheretherketone, or a polyimide,
   the first substrate is configured to have applied a minimum radius of curvature of 1 mm beyond which the first substrate is configured to recover an initial shape of the first substrate, and
   the second substrate is configured to have applied a minimum radius of curvature of 1 mm beyond which the second substrate is configured to recover an initial shape of the second substrate.

2. The photodetector of claim 1, wherein the thickness of the filtering layer is in the range from 50 nm to 150 nm.

3. A system comprising the infrared photodetector of claim 1 and a source of an infrared radiation.

4. A method of manufacturing the photodetector of claim 1, comprising manufacturing the filtering layer at a temperature lower than 200° C.

5. The method of claim 4, wherein the filtering layer is deposited by cathode sputtering, by electron beam physical vapor deposition, by ion beam sputtering, or by thermal evaporation.

* * * * *